(12) United States Patent
Zeidler et al.

(10) Patent No.: US 12,094,683 B2
(45) Date of Patent: Sep. 17, 2024

(54) METHOD FOR OPERATING A MULTI-BEAM PARTICLE BEAM MICROSCOPE

(71) Applicant: Carl Zeiss MultiSEM GmbH, Oberkochen (DE)

(72) Inventors: Dirk Zeidler, Oberkochen (DE); Gregor Dellemann, Aalen (DE); Gunther Scheunert, Muenster (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 0 days.

(21) Appl. No.: 18/181,395

(22) Filed: Mar. 9, 2023

(65) Prior Publication Data

US 2023/0215686 A1 Jul. 6, 2023

Related U.S. Application Data

(63) Continuation of application No. 17/212,642, filed on Mar. 25, 2021, now Pat. No. 11,735,393, which is a (Continued)

(30) Foreign Application Priority Data

Sep. 28, 2018 (DE) .......................... 102018124044.9

(51) Int. Cl.
*H01J 37/244* (2006.01)
*H01J 37/28* (2006.01)

(52) U.S. Cl.
CPC ............ *H01J 37/244* (2013.01); *H01J 37/28* (2013.01); *H01J 2237/2443* (2013.01);
(Continued)

(58) Field of Classification Search
CPC ..................... H01J 37/244; H01J 37/28; H01J 2237/2443; H01J 2237/2445;
(Continued)

(56) References Cited

U.S. PATENT DOCUMENTS 4,130,761 A 12/1978 Matsuda
4,153,843 A 5/1979 Pease
(Continued)

FOREIGN PATENT DOCUMENTS

CN 107210176 A 9/2017
CN 107615750 A 1/2018
(Continued)

OTHER PUBLICATIONS

US 11,615,940 B2, 03/2023, Zeidler et al. (withdrawn)
(Continued)

*Primary Examiner* — David A Vanore
(74) *Attorney, Agent, or Firm* — Fish & Richardson P.C.

(57) ABSTRACT

A method for operating a multi-beam particle beam microscope includes: scanning a multiplicity of particle beams over an object; directing electron beams emanating from impingement locations of the particle beams at the object onto an electron converter; detecting first signals generated by impinging electrons in the electron converter via a plurality of detection elements of a first detection system during a first time period; detecting second signals generated by impinging electrons in the electron converter via a plurality of detection elements of a second detection system during a second time period; and assigning to the impingement locations the signals which were detected via the detection elements of the first detection system during the first time period, for example on the basis of the detection signals which were detected via the detection elements of the second detection system during the second time period.

20 Claims, 8 Drawing Sheets

Related U.S. Application Data continuation of application No. PCT/EP2019/076429, filed on Sep. 30, 2019.

(52) U.S. Cl.
CPC ............... *H01J 2237/2445* (2013.01); *H01J 2237/2446* (2013.01); *H01J 2237/24495* (2013.01); *H01J 2237/24578* (2013.01)

(58) Field of Classification Search
CPC ..... H01J 2237/2446; H01J 2237/24495; H01J 2237/24578; H01J 2237/2817
See application file for complete search history.

(56) References Cited

U.S. PATENT DOCUMENTS

| | | | |
|---|---|---|---|
| 4,200,794 A | 4/1980 | Newberry | |
| 4,338,548 A | 7/1982 | Bono | |
| 4,742,234 A | 5/1988 | Feldman | |
| 5,215,623 A | 6/1993 | Takahashi | |
| 5,864,142 A | 1/1999 | Muraki | |
| 5,892,224 A | 4/1999 | Nakasuji | |
| 5,905,267 A | 5/1999 | Muraki | |
| 5,981,954 A | 11/1999 | Muraki | |
| 6,107,636 A | 8/2000 | Muraki | |
| 6,124,599 A | 9/2000 | Muraki | |
| 6,137,113 A | 10/2000 | Muraki | |
| 6,323,499 B1 | 11/2001 | Muraki | |
| 6,333,508 B1 | 12/2001 | Katsap | |
| 6,617,595 B1 | 9/2003 | Okunuki | |
| 6,633,366 B2 | 10/2003 | De Jager | |
| 6,696,371 B2 | 2/2004 | Butschke | |
| 6,787,780 B2 | 9/2004 | Hamaguchi | |
| 6,804,288 B2 | 10/2004 | Haraguchi | |
| 6,818,911 B2 | 11/2004 | Tamamori | |
| 6,835,508 B2 | 12/2004 | Butschke | |
| 6,872,950 B2 | 3/2005 | Shimada | |
| 6,903,345 B2 | 6/2005 | Ono | |
| 6,903,353 B2 | 6/2005 | Muraki | |
| 6,917,045 B2 | 7/2005 | Hashimoto | |
| 6,919,574 B2 | 7/2005 | Hashimoto | |
| 6,943,349 B2 | 9/2005 | Adamec | |
| 6,953,938 B2 | 10/2005 | Iwasaki | |
| 6,992,290 B2 | 1/2006 | Watanabe | |
| 7,005,658 B2 | 2/2006 | Muraki | |
| 7,015,467 B2 | 3/2006 | Maldonado | |
| 7,060,984 B2 | 6/2006 | Nagae | |
| 7,084,411 B2 | 8/2006 | Lammer-Pachlinger | |
| 7,091,504 B2 | 8/2006 | Wieland | |
| 7,109,494 B2 | 9/2006 | Ono | |
| 7,126,141 B2 | 10/2006 | Ono | |
| 7,129,502 B2 | 10/2006 | Kruit | |
| 7,244,949 B2 | 7/2007 | Knippelmeyer | |
| 7,285,779 B2 | 10/2007 | Litman | |
| 7,375,326 B2 | 5/2008 | Sender | |
| 7,420,164 B2 | 9/2008 | Nakasuji | |
| 7,468,507 B2 | 12/2008 | Rogers | |
| 7,504,622 B2 | 3/2009 | Elyasaf | |
| 7,535,001 B2 | 5/2009 | Sender | |
| 7,601,972 B2 | 10/2009 | Nakasuji | |
| 7,619,203 B2 | 11/2009 | Elyasaf | |
| 7,696,497 B2 | 4/2010 | Rogers | |
| 8,035,082 B2 | 10/2011 | Yamazaki | |
| 8,134,135 B2 | 3/2012 | Kruit | |
| 8,350,214 B2 | 1/2013 | Otaki | |
| 8,362,425 B2 | 1/2013 | Han | |
| 8,384,051 B2 | 2/2013 | Ozawa | |
| 8,598,525 B2 | 12/2013 | Zeidler | |
| 8,618,496 B2 | 12/2013 | Wieland | |
| 8,704,192 B2 | 4/2014 | Sano | |
| 8,748,842 B2 | 6/2014 | Ohashi | |
| 8,779,399 B2 | 7/2014 | Yamanaka | |
| 8,829,465 B2 | 9/2014 | Tsunoda | |
| 8,963,099 B2 | 2/2015 | Yamada | |
| 9,153,413 B2 | 10/2015 | Almogy | |
| 9,263,233 B2 * | 2/2016 | Zeidler | H01J 37/28 |
| 9,336,981 B2 | 5/2016 | Knippelmeyer | |
| 9,336,982 B2 | 5/2016 | Zeidler | |
| 9,349,571 B2 | 5/2016 | Kemen | |
| 9,368,314 B2 | 6/2016 | Nakasuji | |
| 9,530,613 B2 | 12/2016 | Rogers | |
| 9,536,702 B2 | 1/2017 | Lang | |
| 9,607,805 B2 | 3/2017 | Liu | |
| 9,653,254 B2 | 5/2017 | Zeidler | |
| 9,702,983 B2 | 7/2017 | Eder | |
| 9,922,799 B2 | 3/2018 | Li | |
| 9,991,089 B2 | 6/2018 | Mueller | |
| 10,043,634 B2 * | 8/2018 | Ogasawara | H01J 37/28 |
| 10,062,541 B2 | 8/2018 | Ren | |
| 10,141,160 B2 | 11/2018 | Ren | |
| 10,176,965 B1 * | 1/2019 | Breuer | H01J 37/10 |
| 10,354,831 B2 | 7/2019 | Kemen | |
| 10,388,487 B2 | 8/2019 | Zeidler | |
| 10,535,494 B2 | 1/2020 | Zeidler | |
| 10,541,112 B2 | 1/2020 | Schubert | |
| 10,586,677 B1 | 3/2020 | Okada | |
| 10,600,613 B2 * | 3/2020 | Zeidler | H01J 37/10 |
| 10,622,184 B2 | 4/2020 | Knippelmeyer | |
| 10,643,820 B2 | 5/2020 | Ren | |
| 10,741,355 B1 | 8/2020 | Zeidler et al. | |
| 10,811,215 B2 * | 10/2020 | Zeidler | H01J 37/153 |
| 10,854,423 B2 * | 12/2020 | Sarov | H01J 37/12 |
| 10,879,031 B2 | 12/2020 | Ren | |
| 10,896,800 B2 * | 1/2021 | Riedesel | H01J 37/09 |
| 11,049,686 B2 | 6/2021 | Zeidler et al. | |
| 11,069,508 B2 | 7/2021 | Zeidler et al. | |
| 11,087,955 B2 | 8/2021 | Zeidler et al. | |
| 11,158,482 B2 * | 10/2021 | Zeidler | H01J 37/09 |
| 11,164,715 B2 * | 11/2021 | Zeidler | H01J 37/05 |
| 11,239,053 B2 | 2/2022 | Zeidler et al. | |
| 11,295,930 B2 | 4/2022 | Wang et al. | |
| 11,562,881 B2 * | 1/2023 | Zeidler | H01J 37/06 |
| 11,735,393 B2 * | 8/2023 | Zeidler | H01J 37/244 250/307 |
| 2006/0289804 A1 | 12/2006 | Knippelmeyer et al. | |
| 2009/0014649 A1 | 1/2009 | Nakasuji | |
| 2009/0114818 A1 | 5/2009 | Casares et al. | |
| 2009/0159810 A1 | 6/2009 | Knippelmeyer et al. | |
| 2009/0256075 A1 | 10/2009 | Kemen et al. | |
| 2010/0320382 A1 | 12/2010 | Almogy et al. | |
| 2013/0299697 A1 | 11/2013 | Enyama et al. | |
| 2014/0197322 A1 | 7/2014 | Eder et al. | |
| 2014/0197325 A1 | 7/2014 | Kato | |
| 2015/0069235 A1 | 3/2015 | Kemen et al. | |
| 2015/0083911 A1 | 3/2015 | Zeidler et al. | |
| 2015/0155136 A1 | 6/2015 | Scheffers | |
| 2015/0348738 A1 | 12/2015 | Zeidler et al. | |
| 2016/0268096 A1 * | 9/2016 | Ren | H01J 37/1472 |
| 2017/0133198 A1 | 5/2017 | Kruit | |
| 2017/0154756 A1 | 6/2017 | Ren et al. | |
| 2017/0243715 A1 * | 8/2017 | Ogasawara | H01J 37/244 |
| 2017/0316912 A1 | 11/2017 | Zeisler et al. | |
| 2018/0276843 A1 | 9/2018 | Send et al. | |
| 2019/0333732 A1 | 10/2019 | Ren | |
| 2019/0355545 A1 * | 11/2019 | Zeidler | H01J 37/21 |
| 2020/0124546 A1 | 4/2020 | Hu et al. | |
| 2020/0211810 A1 | 7/2020 | Zeidler | |
| 2020/0243300 A1 | 7/2020 | Zeidler | |
| 2020/0373116 A1 | 11/2020 | Zeidler | |
| 2020/0381207 A1 * | 12/2020 | Ren | H01J 37/09 |
| 2021/0005423 A1 | 1/2021 | Zeidler | |
| 2021/0035773 A1 | 2/2021 | Zeidler | |
| 2021/0193437 A1 * | 6/2021 | Ren | H01J 37/292 |
| 2021/0210306 A1 | 7/2021 | Zeidler et al. | |
| 2023/0215686 A1 * | 7/2023 | Zeidler | H01J 37/28 250/307 |

FOREIGN PATENT DOCUMENTS

| | | |
|---|---|---|
| CN | 108139578 A | 6/2018 |
| DE | 10 2015 202 172 A1 | 8/2016 |
| GB | 2519511 A | 4/2015 |
| GB | 2521819 A | 7/2015 |
| JP | 59184524 A | 10/1984 |

(56) References Cited

FOREIGN PATENT DOCUMENTS

| | | | |
|---|---|---|---|
| JP | 60042825 A | 3/1985 |
| JP | 60105229 A | 6/1985 |
| JP | 61263217 A | 11/1986 |
| JP | 2002-157969 A | 5/2002 |
| JP | 2014229481 A | 12/2014 |
| SU | 769611 A1 | 10/1980 |
| TW | 200519697 A | 6/2005 |
| WO | WO 2005/024881 A2 | 3/2005 |
| WO | WO 2007/028595 A2 | 3/2007 |
| WO | WO 2007/028596 A1 | 3/2007 |
| WO | WO 2007/060017 A2 | 5/2007 |
| WO | WO 2012/151288 A1 | 11/2012 |
| WO | WO2013032949 A1 | 3/2013 |
| WO | WO 2016/124648 A1 | 8/2016 |
| WO | WO 2018/172186 A1 | 9/2018 |
| WO | WO2020057678 A1 | 3/2020 |
| WO | WO2020064035 A1 | 4/2020 |
| WO | WO2020065094 A1 | 4/2020 |
| WO | WO2020070074 A1 | 4/2020 |
| WO | WO2020151904 A2 | 7/2020 |
| WO | WO2020249147 A1 | 12/2020 |
| WO | WO 2021/028366 A1 | 2/2021 |

OTHER PUBLICATIONS

China National Intellectual Property Administration (CNIPA) Office Action, with translation thereof, for corresponding CN Appl No. 201980063653.5, dated Aug. 31, 2023.
German Office Action, with translation thereof, for corresponding DE application No. 10 2018 124 044.9 dated Jun. 11, 2019.
L. Tian et al., "3D intensity and phase imaging from light field measurements in an LED array microscope", Optica, vol. 2, No. 2, Feb. 2015, pp. 104-111.
J. R. Michael et al., "Applications of high-throughput multibeam SEM in materials science", Sanda National Laboratories, Albuquerque, NM, US, 2015.
P. Kruit et al., "Multi-Beam Scanning Electron Microscope Design", Microscopy and Microanalysis, vol. 22, Suppl. 3, 2016, pp. 574-575.
Translation of International search report for corresponding international application No. PCT/EP2019/076429 dated Jan. 2, 2020.
Translation of International Preliminary Report on Patentability for corresponding international application No. PCT/EP2019/076429 dated Apr. 8, 2021.
Taiwanese Office Action and Search Report, with translation thereof, for corresponding TW Appl No. 108135214, dated Apr. 11, 2023.
Chinese Office Action, with translation thereof, for corresponding CN Appl No. 201980063653.5, dated Mar. 29, 2024.

* cited by examiner

METHOD FOR OPERATING A MULTI-BEAM PARTICLE BEAM MICROSCOPE

CROSS-REFERENCE TO RELATED APPLICATIONS

The present application is a continuation of, and claims benefit under 35 USC 120 to, U.S. application Ser. No. 17/212,642, filed Mar. 25, 2021, which is a continuation of, and claims benefit under 35 USC 120 to, international application PCT/EP2019/076429, filed Sep. 30, 2019, which claims benefit under 35 USC 119 of German Application No. 10 2018 124 044.9, filed Sep. 28, 2018. The entire disclosure of these applications are incorporated by reference herein.

FIELD

The disclosure relates to methods for operating multi-beam particle beam microscopes.

BACKGROUND

US 2015/0083911 A1 discloses a multi-beam particle beam microscope in which a multiplicity of particle beams are directed onto an object and focused there, such that there an array of impingement locations is illuminated with the particle beams. The particle beams generate secondary electrons that leave the object from the impingement locations. A projection system is provided for collecting the secondary electrons and feeding them to a detection system. In this case, secondary electrons emanating from each impingement location are shaped to form a respective electron beam that is fed to exactly one detector element of the detection system. Detection signals of the detector element can thus be assigned to one of the electron beams and thus to one of the multiplicity of impingement locations of the particle beams at the object. In order to record a particle-microscopic image, the multiplicity of particle beams is scanned in parallel over the surface of the object, such that each of the particle beams illuminates a multiplicity of impingement locations. The detection signals detected in this case can thus be assigned by way of the respective scan position to the multiplicity of impingement locations of the multiplicity of particle beams in order to generate the spatially resolved image data of the particle-microscopic image.

SUMMARY

It has been found that the particle-microscopic images generated in the manner explained above can exhibit unexpected unsharpnesses and artefacts in some use situations. The disclosure proposes a multi-beam particle beam microscope and a method for operating same with which sharper images can be generated in some use situations.

In accordance with embodiments of the disclosure, a multi-beam particle beam microscope includes an electron converter, an illumination system configured to illuminate an array of impingement locations at an object with a multiplicity of particle beams, and a projection system configured to direct electron beams emanating from the impingement locations onto the electron converter. The electron converter is configured to convert the energy of the electrons of the electron beams which are directed onto the electron converter into signals, which are subsequently detected. The signals into which the energy of the electrons is converted can be signals of any directly or indirectly detectable type. By way of example, the electron converter can include a scintillator material which converts energy of the electron beams into photons, which are subsequently detected. In this case, the photons can in turn be detected indirectly by the photons generating electron-hole pairs in a semiconductor material, the electron-hole pairs in turn resulting in voltage signals that are converted into digital signals and represent the detected signals. Suitable semiconductor elements for this are avalanche photodiodes, for example. Furthermore, the photons can be detected by their being guided to an electron multiplier via optical waveguides, for example, the electron multiplier converting the photons into voltage signals with high efficiency. The electron converter can furthermore include a semiconductor material, for example, into which the electrons directed onto the electron converter penetrate and generate electron-hole pairs as direct signals that in turn generate voltage signals.

In accordance with exemplary embodiments, the multi-beam particle beam system includes a first detection system having a plurality of detection elements configured to detect first signals generated by impinging electrons in the electron converter, and a second detection system having a plurality of detection elements configured to detect second signals generated by impinging electrons in the electron converter. A detection element is an assembly of the detection system that is configured to detect the signals in such a way that the corresponding detection result is assignable to the detection element. In this regard, by way of example, on the basis of the detection results of two different detection elements, it is possible to decide whether the signal initiating the detection results was detected by one detection element or the other detection element. However, it is not possible, for example, on the basis of a detection result of a single detection element, to ascertain at what point within a detection volume of the detection element the signal was detected. In accordance with exemplary embodiments, the first and/or the second detection system include(s) a CCD detector, and the pixels of the CCD detector are the detection elements.

In accordance with exemplary embodiments, the first and second detection systems differ with regard to a rate at which the respective detection elements detect the signals, and/or with regard to the number of the detection elements of the respective detection system.

In accordance with exemplary embodiments, the first and/or the second detection system include(s) a light detector having an array of detector elements configured to detect signals generated by impinging electrons in the electron converter, wherein the signals are photons. The detection system can then furthermore include an optical imaging system configured to image a surface of the electron converter optically onto the array of detection elements of the detection system.

The projection system can be configured, for example, to image the surface of the object and thus the multiplicity of impingement locations of the particle beams at the object onto the surface of the electron converter.

By way of the optical imaging of the surface of the electron converter onto the array of detector elements of the light detector by the optical imaging system, an image of the impingement locations of the multiplicity of particle beams at the object arises at the array of the detector elements of the light detector.

In accordance with exemplary embodiments, the detector elements of the first detection system include photomultipliers. A photomultiplier consists, for example, of a photocathode and a secondary electron multiplier connected downstream. Photomultipliers are suitable for detecting light signals with a high detection probability and high time resolution. On the other hand, photomultipliers are often expensive devices which typically occupy significant structural space, with the result that the number of the detector elements of the first detection system and thus the spatial resolution thereof is limited in practice if the detector elements of the first detection system are photomultipliers.

In accordance with exemplary embodiments, the detector elements of the second detection system include photodiodes. Using lithographic methods it is possible to produce arrays of photodiodes which provide a high density of detector elements and thus offer a high spatial resolution. Examples of detection systems of this type are CCD sensors having many hundreds of thousands of detector elements or pixels. However, detection systems of this type have the disadvantage that they are readable at a relatively low rate and thus comparatively slowly, which is why the detection of the light signals generated by the electron converter solely via a CCD sensor is generally not used in practice in the case of multi-beam particle beam microscopes.

In a conventional multi-beam particle beam microscope, a detection system including photomultipliers as detector elements has a number of detector elements which is equal to the number of particle beams directed onto the object by the illumination system. There each of the particle beams is assigned to exactly one detector element of the detection system, and exactly one particle beam is assigned to each detector element of the detection system. The detection signals of each given detector element of the detection system are then assigned to the particle beam which is assigned to the given detector element, and the detection signals are then assigned further to that impingement location of the particle beam at the object onto which the particle beam was directed during the scanning over the surface of the object and then the secondary electrons which initiated the detection signals were generated.

This conventional detection principle assumes that the projection system and the optical imaging system are jointly able to have the effect that secondary electrons generated by a given particle beam impinging on the object result in detection signals substantially of that detector element which is assigned to the given particle beam, while the secondary electrons emanating from the impingement location of the given particle beam do not result in detection signals of other detector elements of the detection system.

The inventors have recognized that this assumption is not always justified in practice and, in some cases, secondary electrons initiated by a given particle beam at the object also result in increased detection signals of detector elements of the light detector which are different from the detector element which is assigned to the given particle beam. This effect may be referred to as "crosstalk".

In accordance with exemplary embodiments of the disclosure, detection signals of the detector elements of the second detection system are used to assign detection signals of the detector elements of the first detection system to particle beams which impinge on the object. As an example, the detection signals of the detector elements of the second detection system are used to assign detection signals of the first detection system to impingement locations of the particle beams at the object.

In accordance with exemplary embodiments of the disclosure, a method for operating a multi-beam particle beam microscope such as was explained above, for example, includes scanning a multiplicity of particle beams over an object in order to illuminate and to displace an array of impingement locations of the particle beams at the object, and directing electron beams emanating from impingement locations of the particle beams at the object onto an electron converter. The method furthermore includes detecting first signals generated by impinging electrons in the electron converter via a plurality of detection elements of a first detection system during a first time period, detecting second signals generated by impinging electrons in the electron converter via a plurality of detection elements of a second detection system during a second time period, and assigning to the impingement locations the signals which were detected via the detection elements of the first detection system during the first time period, specifically on the basis of the detection signals which are detected via the detection elements of the second detection system during the second time period.

In accordance with exemplary embodiments, detecting the first signals via the detection elements of the first detection system is carried out at a rate which is greater than a limit frequency, and detecting the second signals via the detection elements of the second detection system is carried out at a rate which is less than 0.5 times the limit frequency. This means that the detection elements of the second detection system are readable significantly more slowly than the detection elements of the first detection system.

In accordance with exemplary embodiments, a number of the detection elements of the second detection system is more than double the magnitude of a number of the detection elements of the first detection system. This means that the second detection system can achieve a significantly higher spatial resolution than the first detection system.

In accordance with exemplary embodiments, the projection system is configured to image the impingement locations of the particle beams at the object onto a surface of the electron converter via the electron beams emanating from the object. While the particle beams impinging on the object can be focused very well at the object and generate small beam foci at the object, in practice it is not possible to image these small beam foci onto very small beam foci of the electron beams at the surface of the electron converter with the aid of the projection system. This is owing to the fact that the electrons forming the electron beams emanate from the object with a wide energy spectrum, such that the imaging of the electrons from the object onto the surface of the electron converter, which imaging is provided by the projection system, is already erroneous on account of the energy width of the electrons. The electrons emanating from an impingement location at the object thus impinge on an extensive region at the surface of the electron converter. However, it is possible for the projection system to be embodied such that electrons which emanate from mutually adjacent impingement locations of different particle beams at the object illuminate extensive regions in each case at the surface of the electron converter, but mutually different extensive regions from among the latter do not overlap or overlap only slightly. In the conventional multi-beam particle beam microscope, it was assumed that the regions do not overlap one another and the optical imaging of the optical imaging system then images the regions onto the array of detector elements of the first detection system.

The inventors have recognized that the mutually adjacent regions at the surface of the electron converter on which impinge electrons of the electron beams which emanate from mutually adjacent impingement locations at the object can change over time and can change for example during the duration of a recording of a particle-microscopic image by the scanning of the multiplicity of particle beams over the object.

With the aid of the evaluation of the detection signals of the detector elements of the second detection system, which can have a higher spatial resolution than the first detection system, it is possible to detect the type of overlap of these regions illuminated by the electron beams at the surface of the electron converter. This detection can include an image analysis of images detected by the second detection system.

In accordance with exemplary embodiments, detection signals which are detected via a given detector element of the detector elements of the first detection system during the first time period are assigned to at least two different impingement locations. In contrast to the conventional method in which the light signals detected by a given detection element of the first detection system are incorrectly only ever assigned to the particle beam which is assigned to the given detector element, the method in accordance with the embodiments described here allows a more flexible assignment of the detection signals to be effected, which takes account of the current situation and the possible current inadequacies given in the imaging provided by the projection system. By way of example, on the basis of the evaluation of the detection signals of the detector elements of the second detection system, it may be evident that for example 90% of the detection signals of a given detector element of the first detection system are assigned to the particle beam which is assigned to the given detector element, while 10% of the detection signals are assigned to a specific particle beam which impinges on the object adjacent to the particle beam which is assigned to the given detector element. This assignment of detection signals to particle beams and thus to impingement locations at the object, which assignment is more correct in certain respects, can be used to generate particle-microscopic images having comparatively better image properties.

The inventors have recognized that the method described here can be advantageous for example if surface charges distributed inhomogeneously over the surface are present at the examined object. This is the case for example if the extents of the surface charges and the effective range of the surface charges are smaller or much smaller than the extent of that region at the object which is imaged by the totality of the particle beams. Surface charges at the object can be generated for example by the particle beams themselves that scan the object, for which reason the configuration of the surface charges at the object can change over time. Surface charges present locally can have the effect that one or a plurality of electron beams emanating from the impingement locations of the particle beams at the object are deflected in specific, entirely different directions, while other electron beams are not deflected or are deflected differently on account of the effects thereof that decrease with the distance from the surface charges. This has the effect that the configuration of a region illuminated by a given electron beam at the surface of the electron converter can change over time with regard to shape and size. It is possible, however, to detect this change over time in the configuration of the illuminated regions at the electron converter, which regions are in turn imaged onto the detector elements of the first detection system by the optical imaging system, via the evaluation of the detection signals of the second detection system and to take the change into account in the assignment of the detection signals of the detector elements of the first detection system to the particle beams and thus to the impingement locations.

In accordance with exemplary embodiments, detecting detection signals via the detection elements of the first detection system is repeated during a plurality of first time periods, wherein the detection signals detected by a given detection element of the first detection system in one of the plurality of first time periods are assigned at least partly to a given particle beam, and wherein the detection signals detected by the given detection element of the first detection system in another of the plurality of first time periods are assigned in no part to the given impingement location. This means that the assignment of detector elements and the detection signals thereof to particle beams can change for example during a recording of a particle-microscopic image. This change in the assignment is effected on the basis of the detection signals which are detected via the detection elements of the second detection system, which detection signals likewise change during this time.

The number of the detection elements of the first detection system can be equal to the number of the particle beams which are scanned over the object. However, the number of the detection elements of the first detection system can also be greater than the number of the particle beams which are scanned over the object. As an example, the number of the detection elements of the first detection system can be equal to an integral multiple of the number of the particle beams which are scanned over the object. By way of example, the number of the detection elements of the first detection system can be equal to four times or 16 times the number of the particle beams.

BRIEF DESCRIPTION OF THE DRAWINGS

Embodiments of the disclosure are explained in greater detail below with reference to figures, in which.

DESCRIPTION OF EXEMPLARY EMBODIMENTS

Figure 1:
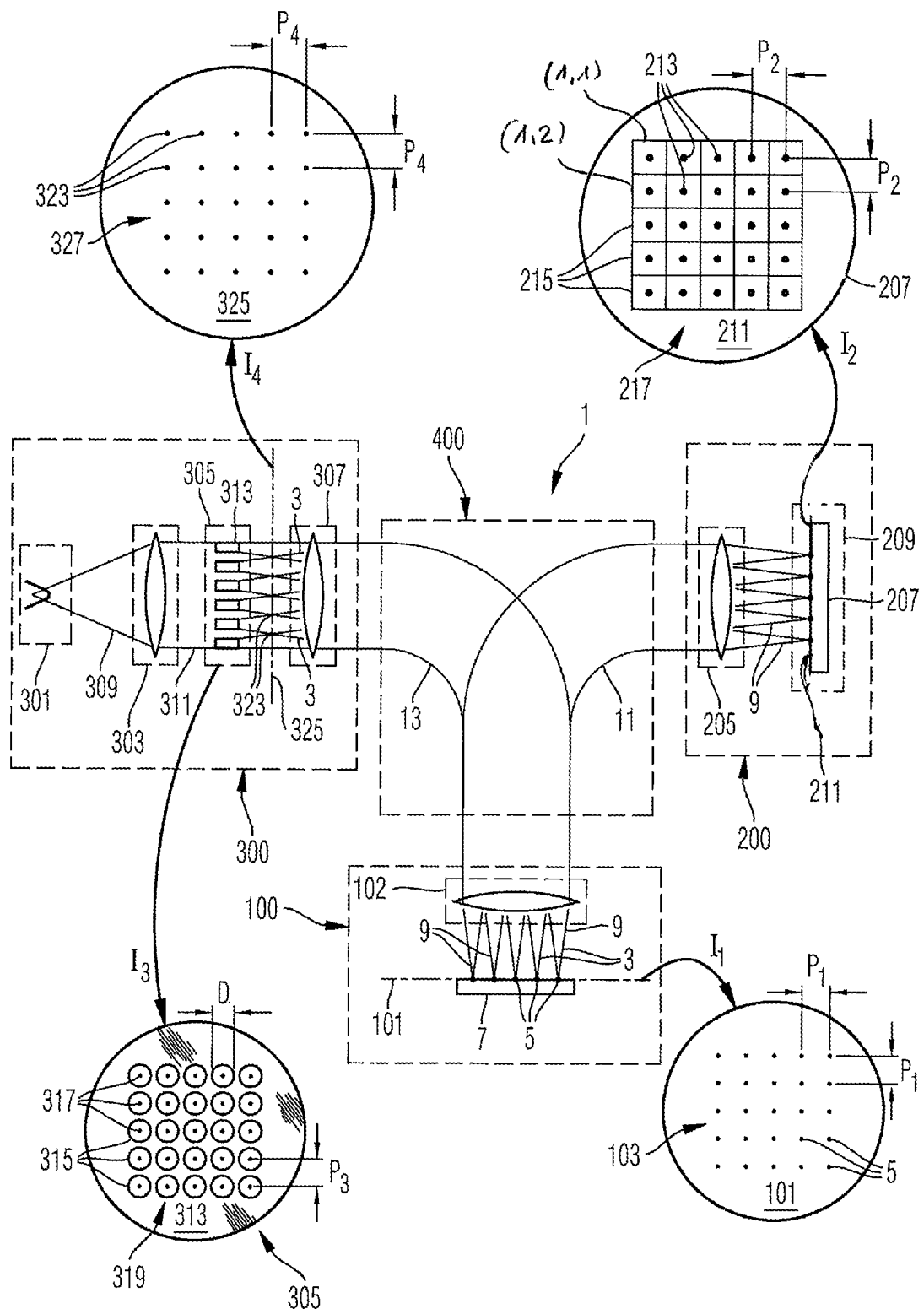
FIG. 1 shows a schematic illustration of a multi-beam particle beam microscope.

FIG. 1 is a schematic illustration of a multi-beam particle beam microscope, which uses a multiplicity of beams of charged particles. The multi-beam particle beam microscope generates a multiplicity of beams of charged particles which impinge on an object to be examined in order to generate there secondary electrons which emanate from the object and are subsequently detected. The multi-beam particle beam microscope 1 is of the scanning electron microscope (SEM) type, which uses a multiplicity of primary electron beams 3 in order to generate a multiplicity of electron beam spots 5 on a surface of the object 7. The object 7 to be examined can be of any desired type and include for example a semiconductor wafer, a biological sample, and an arrangement of miniaturized elements or the like. The surface of the object 7 is arranged in an object plane 101 of an objective lens 102 of an objective lens system 100.

The enlarged excerpt I1 in FIG. 1 shows a plan view of the surface 101 of the object 7 having a regular rectangular array 103 of impingement locations 5 of the particle beams 3 on the surface 101 of the object 7. In FIG. 1, the number of impingement locations is 25, which are arranged as a 5×5 array 103. The number 25 of particle beams 3 or impingement locations is a small number chosen for reasons of simplified illustration. In practice, the number of beam spots can be chosen to be significantly greater, such as, for example, 20×30, 100×100 and the like.

In the embodiment illustrated, the array 103 of impingement locations 5 is a substantially regular rectangular array having a constant distance P1 between adjacent impingement locations 5. Exemplary values of the distance P1 are 1 µm and 10 µm. However, it is also possible for the array 103 to have other symmetries, such as a hexagonal symmetry, for example.

Particle beams 3 can be focused very finely on the impingement locations 5. Diameters of the beam foci formed at the surface of the object can be for example 1 nm, 5 nm, 100 nm and 200 nm. The focusing of the particle beams 3 for shaping the beam spots 5 is carried out by the objective lens system 100.

The particles of the particle beams 3 that impinge on the object generate there electrons that emanate from the surface of the object 7. The electrons emanating from the surface of the object 7 are accelerated by electric fields provided by the objective lens 102 and are shaped to form electron beams 9. The multi-beam particle beam microscope 1 includes a projection system formed by the objective lens 102 and further electron lenses 205. The projection system 102, 205 provides an electron beam path 11 in order to feed the multiplicity of electron beams 9 to an electron detector 209. The electron detector 209 includes an electron converter 207, onto which the electron beams 9 are directed by the projection system 102, 205 and which is configured to generate photons as signals upon the impingement of electrons of the electron beams 9. The photons are detected by light detectors, as will be described below. A material of the electron converter 207 can include a scintillator material, such as, for example, the phosphor material sold under the product designation R42 from El Mul Technologies, Israel.

The excerpt I2 in FIG. 1 shows a plan view of a surface 211 of the electron converter 207 on which the electron beams 9 impinge. The reference sign 213 designates there locations at which centres of the impinging electron beams are arranged. In the ideal situation illustrated in FIG. 1, the centres 213 are arranged in an array 217 at a regular distance P2 from one another. Exemplary values of the distance P2 are 10 µm, 100 µm and 200 µm.

The particle beams 3 are generated by an illumination system 300 including at least one electron source 301, at least one collimation lens 303, a multi-aperture arrangement 305 and a field lens 307. The electron source 301 generates a diverging electron beam 309, which is collimated by the collimation lens 303 to form a beam 311 which illuminates the multi-aperture arrangement 305.

The excerpt 13 in FIG. 1 shows a plan view of the multi-aperture arrangement 305. The multi-aperture arrangement 305 includes a multi-aperture plate 313 having a plurality of openings or apertures 315 formed therein. Midpoints 317 of the openings 315 are arranged in a pattern 319 corresponding to the pattern 103 formed by the impingement locations 5 of the particle beams 3 at the object 7. A distance P3 of the midpoints 317 of the apertures 315 from one another can have exemplary values of 5 µm, 100 µm and 200 µm. The diameters D of the apertures 315 are smaller than the distance P3 between the midpoints of the apertures. Exemplary values of the diameters D are 0.2×P3, 0.4×P3 and 0.8×P3.

Electrons of the illuminating beam 311 pass through the apertures 315 and form electron beams 3. Electrons of the illuminating beam 311 which impinge on the plate 313 are absorbed by the latter and do not contribute to the formation of the electron beams 3.

The multi-aperture arrangement 305 focuses the electron beams 3 in such a way that beam foci 323 are formed in a plane 325. The excerpt 14 in FIG. 1 shows a plan view of the plane 325 with the foci 323 arranged in a pattern 327. A distance P4 between the foci 323 of the pattern 327 can be equal to the distance P3 in the pattern 319 of the multi-aperture plate 313 or be different therefrom. A diameter of the foci 323 can be for example 10 nm, 100 nm and 1 µm.

The field lens 307 and the objective lens 102 provide an imaging system for imaging the plane 325 in which the foci 323 are formed onto the object plane 101, such that an array 103 of impingement locations 5 at the surface of the object 7 is formed there.

A beam switch 400 is arranged in the beam path between the multi-aperture arrangement 305 and the objective lens system 100. The beam switch 400 is also part of the beam path 11 between the objective lens system 100 and the electron detector 209.

More extensive information concerning such multi-beam inspection systems and components used therein, such as, for instance, particle sources, multi-aperture plates and lenses, can be obtained from the patent applications WO 2005/024881 A2, WO 2007/028595 A2, WO 2007/028596 A1, WO 2007/060017 A2, US 2015/0083911 A1 and WO 2016/124648 A1, the disclosure of which in the full scope thereof is incorporated by reference in the present application.

Figure 2:
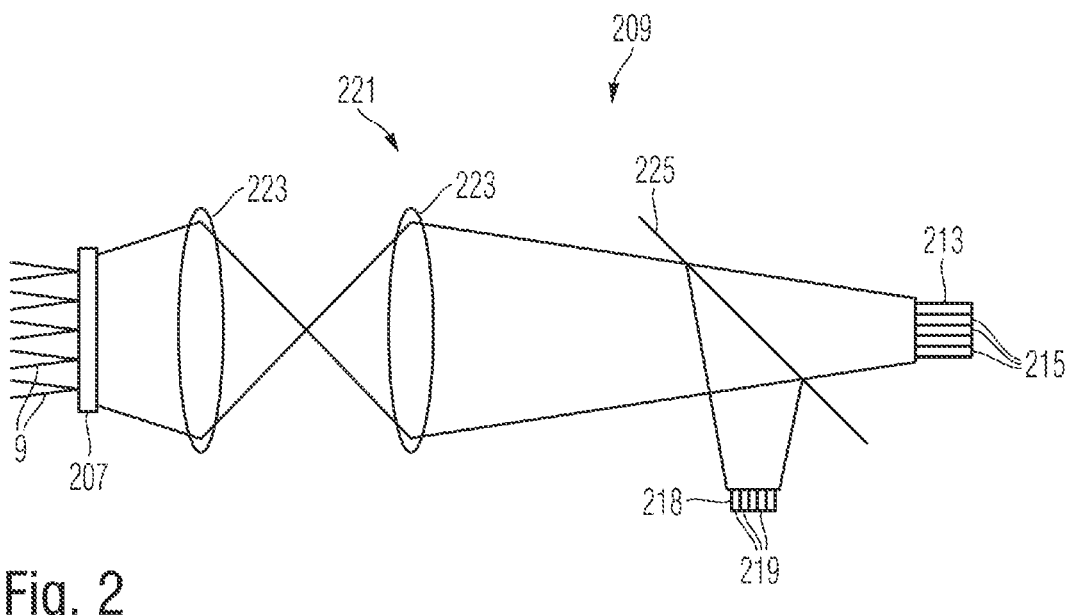
FIG. 2 shows a schematic illustration of an electron detector of the multi-beam particle beam microscope shown in FIG. 1.

FIG. 2 shows further details of the electron detector 209. The electron detector 209 includes, besides the electron converter 207, a first detection system 213 having an array of detector elements 215, and a second detection system 218 having an array of detector elements 219. The first detection system 213 includes a light detector, and the second detection system likewise includes a light detector in the embodiment illustrated. An optical imaging system 221 is configured to image the surface 211 of the electron converter 207 light-optically both onto the array of detector elements 215 of the first detection system 213 and onto the array of detector elements 219 of the second detection system 218. For this purpose, the optical imaging system 221 includes a plurality of lenses 223 and a beam splitter mirror 225, which allows one part of the light impinging on it to pass through to the first detection system 213 and reflects another part of the light impinging on it towards the second detection system 218.

Photons which are generated at the electron converter 207 and which pass through the beam splitter mirror 225 thus form the first signals, which are detected by the first detection system 213, and photons which are generated at the electron converter 207 and which are reflected at the beam splitter mirror 225 form the second signals, which are detected by the second detection system 218.

However, it is also possible for the light which impinges on the first detection system 213 to be reflected at the beam splitter mirror 225, while the light which impinges on the second detection system 218 passes through the beam splitter mirror 225. In this case, provision can be made for the beam splitter mirror 225 to be designed such that the proportion of the light impinging thereon which is fed to the first detection system 213 is five times, ten times or 50 times greater than the proportion which is fed to the second detection system 218.

Figure 3:
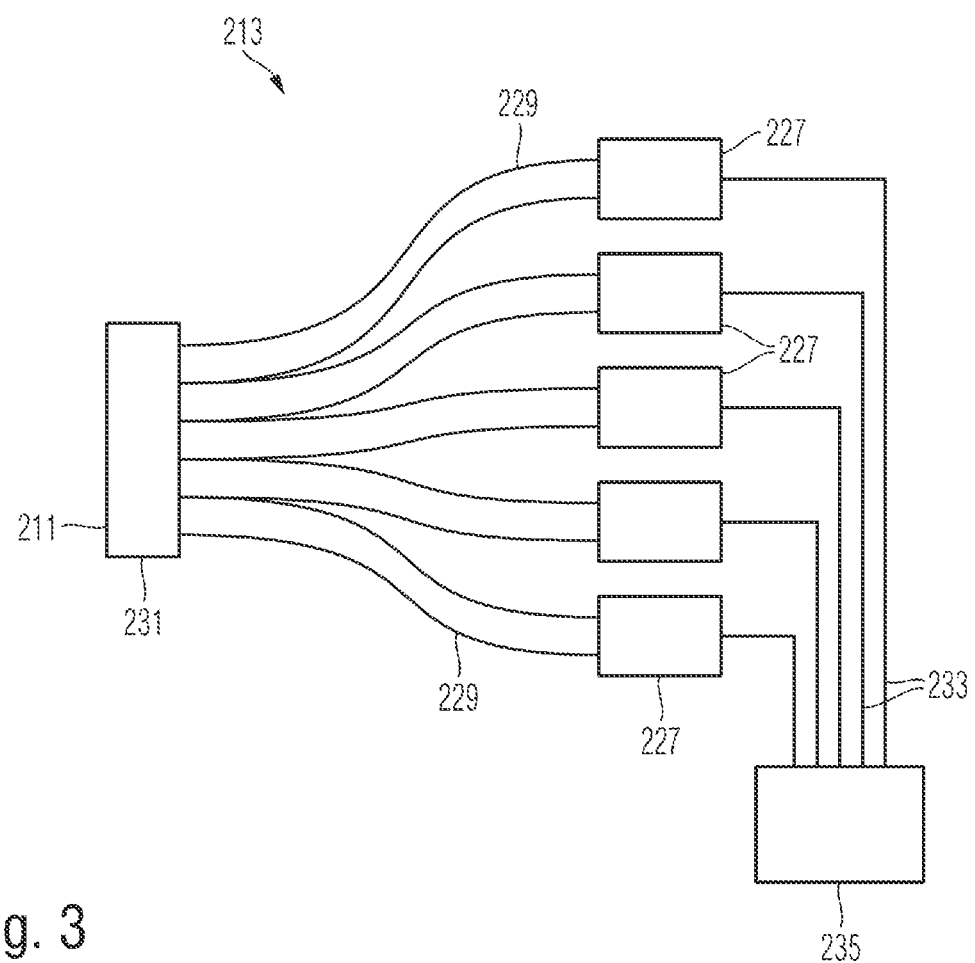
FIG. 3 shows a schematic illustration of a first detection system of the electron detector shown in FIG. 2.
Figure 4:
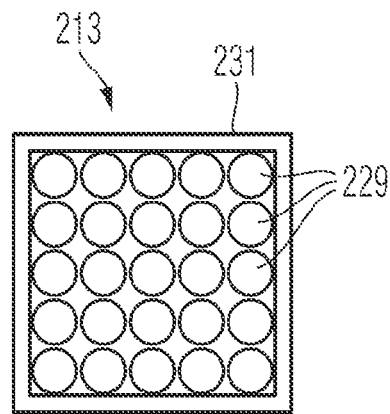
FIG. 4 shows a schematic illustration of an array of detector elements of the first detection system shown in FIG. 3.

Details of the first detection system 213 are illustrated schematically in FIG. 3. The first detection system 213 includes a plurality of photomultipliers 227. The number of the photomultipliers 227 can correspond to the number of the particle beams 3, but it can also be greater. Each of the photomultipliers 227 is connected to one end of an optical waveguide 229 in order to feed light to be detected to the photomultiplier 227. The respective other ends of the optical waveguides 229 are combined in a frame 231 in order to arrange the ends of the optical waveguides 229 in an array whose geometry corresponds to the geometry of the array 217 (FIG. 1, I2) formed by the impinging electron beams 9 on the surface of the electron converter 207. The array 217 on the surface of the electron converter 207 is imaged onto the array of ends of the optical waveguides 229 by the optical imaging system 221. FIG. 4 illustrates a plan view of the array formed by the ends of the optical waveguides 229 that are held in the frame 231.

The electrons of the electron beams 9 which impinge on the electron converter 207 generate photons, a portion of which emerges from the electron converter 207 in a direction towards the optical imaging system 221. The optical imaging system 221 uses the photons in order to image the impingement locations 213 of the electron beams 9 onto the ends of the optical waveguides 229. A portion of the photons enters the optical waveguides 229 and is fed to the photomultipliers 227 by the optical waveguides. The photomultipliers 227 convert the incoming photons into electronic signals, which are fed to a controller 235 via signal lines 233. The controller 235 is thus able to detect the detection signals of a given photomultiplier 227, wherein the intensity of the detected signals is substantially proportional to the intensity of one of the electron beams 9, which is assigned to the respective photomultiplier 227.

Figure 5:
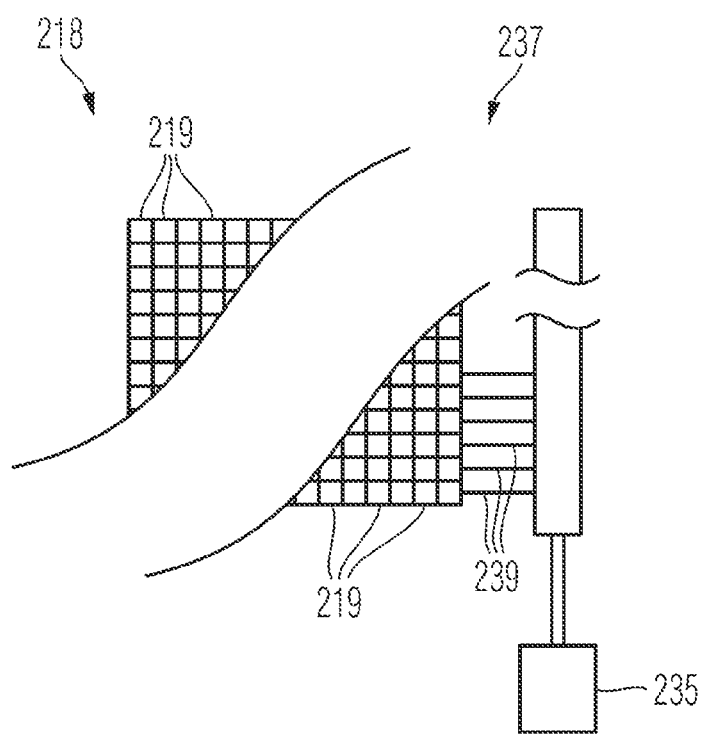
FIG. 5 shows a schematic illustration of a plan view of an array of detector elements of a second detection system of the electron detector shown in FIG. 2.

FIG. 5 shows a plan view of the detector elements 219 of the second detection system 218. The detector elements 219 are formed by the photodiodes of a CCD sensor 237, in which the photodiodes 219 are arranged in a rectangular array. A number of the detector elements 219 of the second detection system 218 can be for example 128×128, 1024× 1024 or other values. The detector elements 219 of the CCD sensor 237 are read row by row via lines 239 from the array of detector elements 219 and the signals are transmitted to the controller 235.

Figure 6:
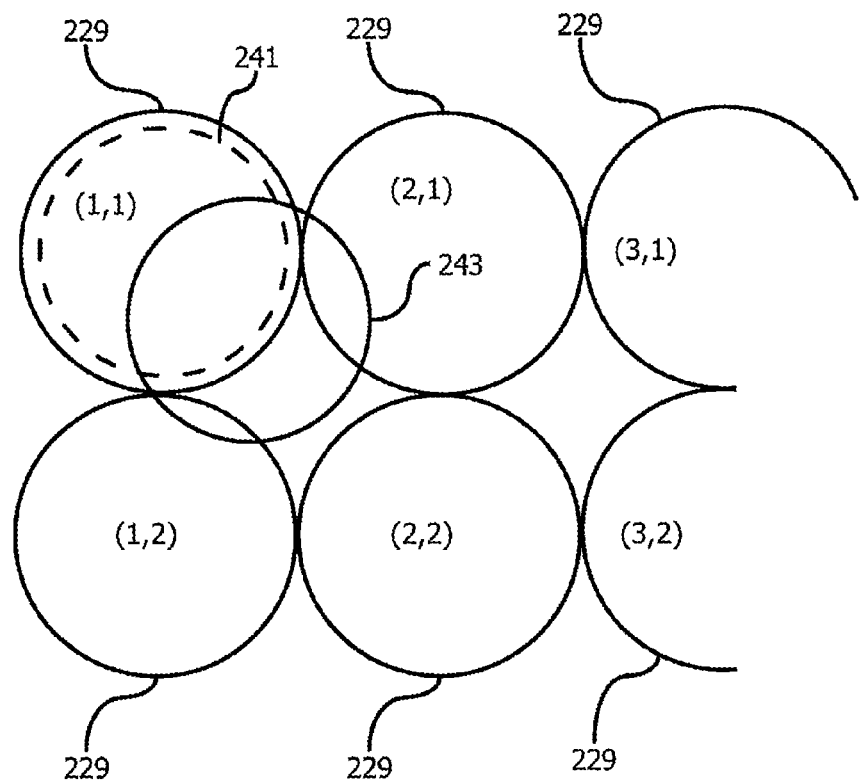
FIG. 6 shows an enlarged partial illustration of the array of detector elements from FIG. 4 for elucidating a method in accordance with one embodiment.

FIG. 6 is an enlarged partial illustration of the array of the ends of the optical waveguides 229 that is shown in FIG. 4. Just the four optical waveguides which are arranged at the top left in the array in FIG. 4 are illustrated here. These ends of the optical waveguides 229 can be designated by array indices (1,1); (2,1); (1,2); and (2,2). A circle represented by an interrupted line 241 encloses an area within which 90% of the photons would impinge on the end of the optical waveguide 229 having the array index (1,1) in the situation outlined above as ideal, in which situation each particle beam is assigned to exactly one detector element of the first detection system and exactly one particle beam 3 is assigned to each detector element of the first detection system. For example, in this situation, the particle beam which illuminates the impingement location 5 arranged at the top left in the array 103 (cf. I1, FIG. 1) and generates secondary electrons that are shaped to form an electron beam 9 which illuminates the segment arranged at the top left in the array 217 (cf. I2, FIG. 1) on the surface 211 of the electron converter 207 and generates there photons that are imaged onto the end of the optical waveguide (1,1) by the imaging optical unit 221. If that is the case, all detection signals detected by the photomultiplier 227 connected to the optical waveguide (1,1) can be assigned to the particle beam arranged at the top left in the array 103.

In a departure from this ideal situation, in practice situations occur in which 90% of the photons initiated by this one particle beam do not land in the circle 241, but rather in a circle 243 arranged offset with respect thereto, this circle being represented by a solid line in FIG. 6. This displacement may be attributable for example to the fact that at the surface of the object 7 electrical charges are present which deflect the beam 9 of secondary electrons from its ideal path, such that the photons initiated by this beam at the electron converter 207 land for the most part within the circle 243. This means that one portion of the photons enters the fibre end (2,1) and a further portion enters the fibre end (1,2). In the case of the situation illustrated in FIG. 6, it could be assumed that the detection signals that are to be ascribed to the particle beam 3 explained result from a sum of detection signals which are detected by different photomultipliers 227. For the situation illustrated in FIG. 6, the intensity I of detection signals that is to be assigned to the particle beam 3 could result for example as follows:

$$I=0.8 \times I(1,1)+0.15 \times I(2,1)+0.05 \times I(1,2)$$

The factors 0.8, 0.15 and 0.05 result from a geometric consideration concerning the overlap of the circle 243 with the areas of the ends of the fibres 229. If appropriate, this consideration can also take account of the inhomogeneous distribution of the intensities of the photons within the circle. The distribution of the intensities usually follows a Gaussian function having a high central maximum and outliers also extending to outside the circle 243.

The position of the circle 243 cannot be determined with the aid of the first detection system alone. However, the position of the circle 243 can be detected with the aid of the second detection system 218, which receives the same distribution of light intensities as the first detection system, but offers a better spatial resolution on account of its larger number of detector elements. An image analysis of images detected by the second detection system 218 thus makes it possible to determine, for each of the particle beams 3, a circle 243 assigned thereto on the area of the ends of the optical fibres 229. On the basis of the overlap of the circles 243 with the ends of the optical fibres 229, it is then possible to determine the proportions in which detection signals of the individual detector elements of the first detection system are to be assigned to which particle beams 3.

The factors chosen by way of example above arose under the assumption that the detector elements (1,1), (2,1) and (1,2) receive no signals originating from particle beams other than that represented by the circle 243. In general it is desirable to solve a system of equations in order to obtain the correct assignments of detection signals to particle beams. The solution of such a system of equations is simplified if the number of the detection elements of the first detection system is greater than the number of the particle beams 3.

The method explained here thus makes it possible to assign to each of the particle beams 3 detection signals which were detected by a plurality of detector elements 215 of the first detection system 213. This is effected on the basis of an image analysis of images recorded by the second detection system 218. This method results in images having higher contrast and fewer artefacts since not all detection signals which are detected by a given detector element 215 of the first detection system 213 are only ever assigned to exactly one of the particle beams 3.

This method is explained once again below with reference to the block diagram in FIG. 7. The reference sign 251 therein denotes a vector of signal intensities I1, I2, . . . I25 which are detected by the 25 detector elements 215 of the first detection system 213 within a first time period. During a second time period, which can temporally precede the first time period, which can temporally succeed the first time period, which can be shorter or longer than the first time period and which can lie within the first time period or can contain the first time period, an image is recorded via the second detection system 218, which image is subjected to an image analysis 253. On the basis of the image analysis 253, the proportions in which the detection signals detected by the detector elements 215 of the first detection system 213 are to be assigned to individual particle beams 3 are determined. The proportions can be represented as a matrix, for example, by which the vector 251 is multiplied in order to obtain a vector 255, the elements I'1, I'2, . . . I'25 of which represent the detected intensities assigned to the individual beams. As mentioned above, a solution of a system of equations or some other complex calculation, such as an iterative calculation, for instance, may be desirable in order to obtain the matrix. In the case in which the number of the detector elements of the first detection system is greater than the number of the particle beams, the vector 251 has a number of components which is equal to the number of the detector elements of the first detection system, while the number of components of the vector 255 is equal to the number of the particle beams. If a matrix is used in order to obtain the vector 255 from the vector 251, then this matrix would accordingly be non-square.

Figure 7:
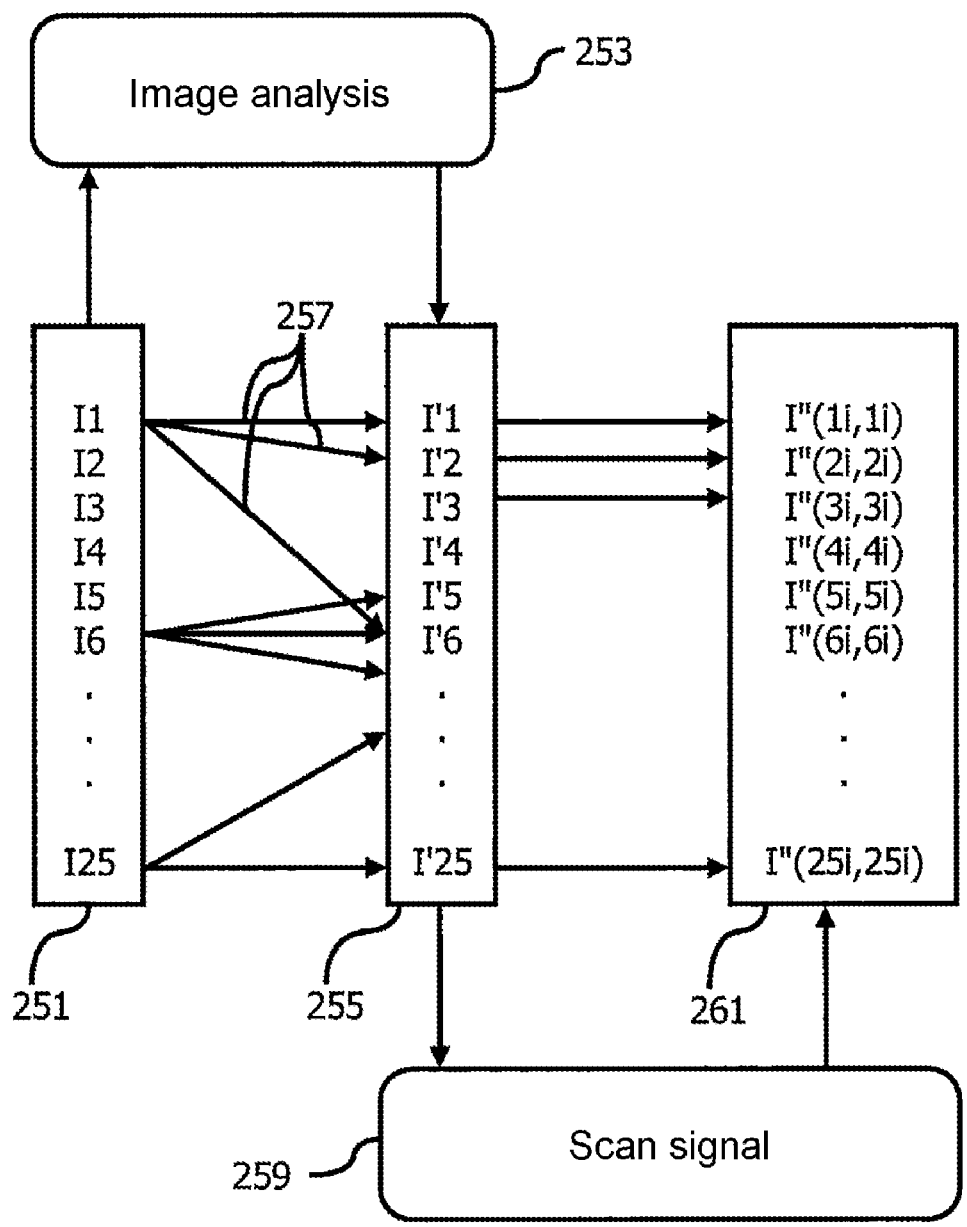
FIG. 7 shows a block diagram for elucidating the method elucidated with reference to FIG. 6.

Arrows 257 in FIG. 7 represent the fact that detection signals detected by a detector element are assigned to a plurality of beams. In this regard, by way of example, intensities detected by the first detector element I1 are assigned to the beams 1, 2 and 6, but not to the rest of the beams.

The method furthermore includes scanning the particle beams 3 over the surface of the object. For this purpose, by way of example, the controller 235 can include a scan generator that provides a suitable scan signal 259. On the basis of the scan signal 259, a beam deflector is supplied with temporally variable voltages, the beam deflector being arranged in the region of the beam path 13 for example in or near the objective lens 102 in order to deflect the bundle of the particle beams 3 jointly on the basis of the scan signal, such that the impingement locations 5 of the particle beams 3 on the surface of the object 7 are displaced.

In this regard, by way of example, the impingement locations 5 of the particle beams 3 on the surface of the object 7 can be displaced to new impingement locations 5 step by step after a predefined time period has elapsed, which time period can be equal to the first time period, such that a very large multiplicity of impingement locations 5 are successively illuminated with the particle beams 3. Finally, the detected detection signals are assigned to the impingement locations in order to form the particle-microscopic image. FIG. 7 illustrates a vector 261 representing detected signal intensities I" which are assigned to impingement locations (1$i$,1$i$), (2$i$, 2$i$), . . . in such a time step during a first time interval i. In this case, the variable i represents an index of the successively implemented time steps. The assignment of the detection signals of the vector 255 which are assigned to the individual particle beams 3 to detection signals of the vector 261 which are assigned to individual impingement locations is carried out on the basis of the scan signal 259 of the scan generator.

One example of the operation of the scan generator and of the generation of the scan signal 259 is explained below with reference to FIG. 8. The latter shows a plan view of the surface of the object 7 and impingement locations 5 which are illuminated successively in the context of the scanning within the time steps implemented. The 255 impingement locations which are illuminated successively by the first particle beam 3 are designated by (11,11), (12,12), . . . (1225,1225). These lie within a square region 263 of the surface of the object, which region contains 225 impingement locations. The impingement locations generated successively by the scanning are connected to one another in FIG. 8 by a line representing the scan path of the particle beam. It is evident that the scan path proceeds in a meandering fashion. For example, the region 263 of the surface of the object 7 contains nine regions 265, each containing 25 impingement locations, which are contained successively in the scan path. The regions 265 of the surface of the object are significantly smaller than the regions 263 of the surface of the object. In order to correctly assess the ratios of the sizes of the regions 263 and 265, the convex envelopes of the impingement locations contained in the regions 263 and 265, respectively, are considered in each case. The convex envelope of a set of impingement locations is the smallest possible area having a convex edge which contains all of the impingement locations.

Figure 8:
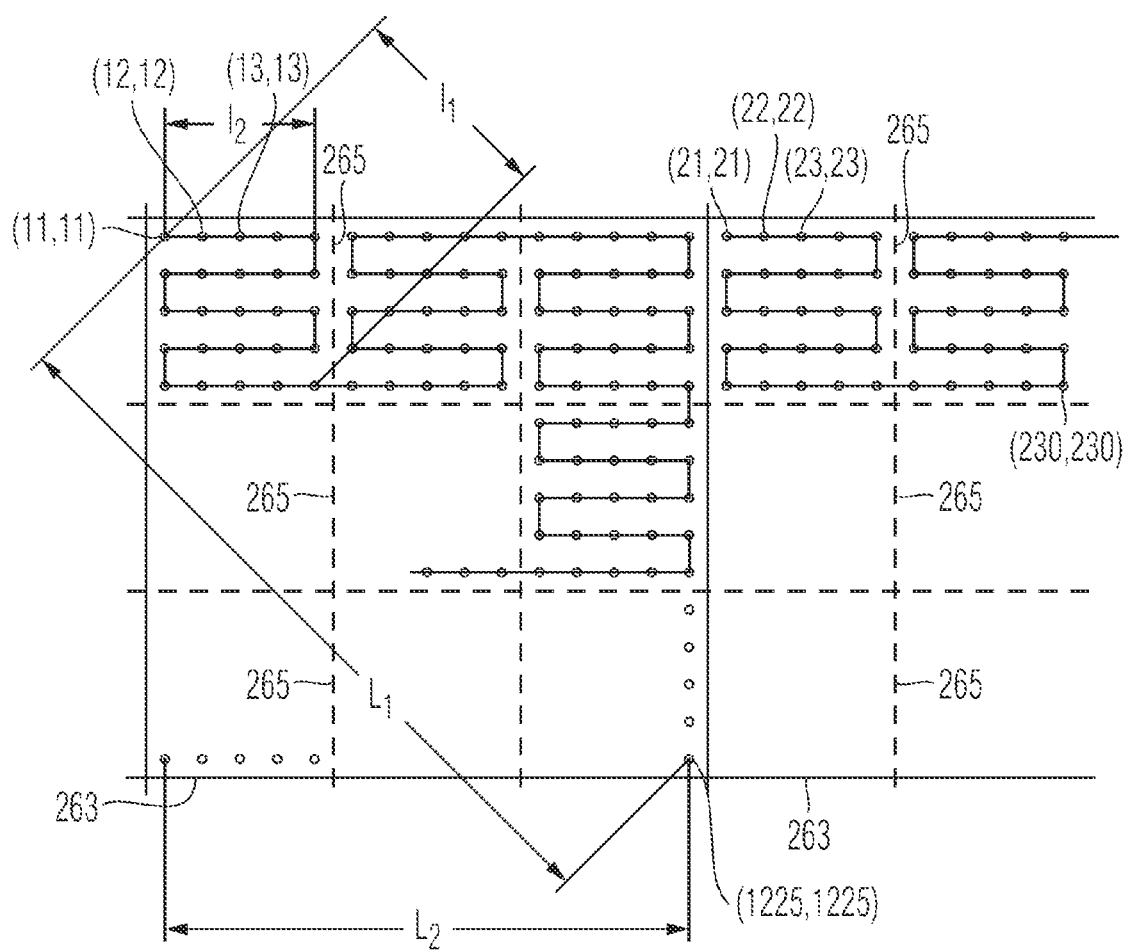
FIG. 8 shows an illustration of scan paths of the method elucidated with reference to FIGS. 6 and 7.

The maximum lateral extent of the convex envelope of the impingement locations which lie in the surface region 265 is designated by l1 in FIG. 8, the minimum lateral extent of the impingement locations is designated by l2, and the maximum lateral extent of the convex envelope of the impingement locations contained in the surface region 263 is designated by L1 in FIG. 8, while the minimum lateral extent of the impingement locations is designated by L2. It is evident that it holds true that:

$$2 \times l1 < L1 \text{ and } 2 \times l2 < L2$$

This means that the surface regions 265 are significantly smaller than the surface regions 263 with regard to their lateral extent.

Figure 9:
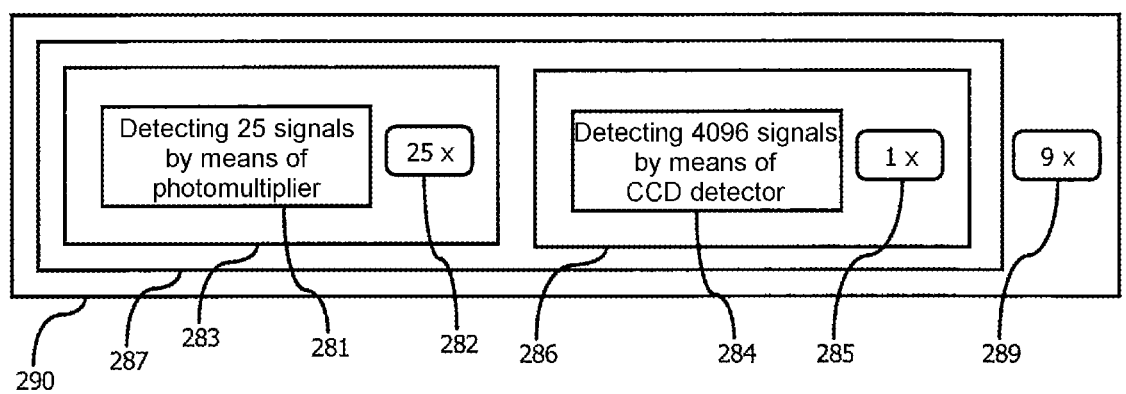
FIG. 9 shows a further block diagram for elucidating the method elucidated with reference to FIGS. 6 to 8.

The scanning method is explained once again below with reference to FIG. 9. To summarize, the scanning method proceeds as follows: the scan signals 259 generated by the scan generator are not altered during a first time duration. During the first time duration, the individual particle beams 3 thus illuminate unchanged impingement locations at the surface of the object. A vector 251 composed of detection signals that are detected by the photomultipliers 227 during the first time period is recorded. This measure that takes place during the first time period is represented by a block 281 in FIG. 9. The scan signal is thereupon altered in order to displace the impingement locations of the particle beams at the object along their scan paths by a position. The measure of block 281 is repeated there. After 25 such repetitions, which are represented by a block 282 in FIG. 9, all 25 impingement locations lying in one of the surface regions 265 have been scanned. This measure of scanning the 25 impingement locations within one of the surface regions 265 is represented by a block 283 in FIG. 9. Carrying out the measures of block 283 lasts for a second time duration, which is approximately 25 times longer than the first time duration.

During the second time duration, an image is additionally recorded via the detector elements 219 of the second detection system 218. It is assumed here that the number of the detector elements 219 of the second detection system is 4096. The recording of an image is represented by the block 284 in FIG. 9. The measure of recording an image via the second detection system is repeated once within the second time period, as indicated by the block 285 in FIG. 9. Carrying out the single repetition of the recording of the image, which takes place simultaneously with the measures designated by 283, is represented by a block 286 in FIG. 9. The measures 283 and 286 can be carried out in parallel or simultaneously since the first detection system 213 and the second detection system 218 can detect mutually corresponding signals simultaneously on account of the beam splitter 225. The simultaneous implementation of the measures 283 and 286 is represented by a block 287 in FIG. 9 and firstly includes the detection of detection signals assigned to the impingement locations arranged within one of the regions 265 and the detection of an image via the second detection system 218. On the basis of the image detected by the second detection system 218, i.e. on the basis of the image analysis 253 carried out on the basis of the image, all 25 vectors 251 obtained within the second time period are converted into 25 vectors 255 respectively representing the detection signals assigned to the individual particle beams.

This means that the detection signals obtained in 25 successively implemented measures 281 are assigned to the individual particle beams in accordance with the same assignment, wherein this assignment is based on a single image obtained in the measure 284 likewise during the second time period, the image being recorded via the second detection system.

Generally it would be desirable to carry out the measure 284 once during each first time period and thus to record via the second detection system a number of images that is exactly the same as the number of measures 281 carried out. However, it is not possible to record and read out images in the illustrated example with the CCD detector with the frequency corresponding to the first time period, which is why the measure 284 is carried out only once, while the measure 281 is carried out 25 times. In return, however, the CCD detector has a sufficiently high spatial resolution to ascertain by image analysis which of the detector elements 215 of the first detection system 213 receive detection signals which are to be assigned to individual particle beams.

The measures of the block 287 are repeated nine times, as indicated by the block 289, in order to scan successively with each of the particle beams one of the nine surface regions 265 contained in the surface region 263. The totality of these measures is designated by a block 290 in FIG. 9 and includes obtaining particle-microscopic image data via 25 particle beams which are directed in each case onto 255 impingement locations, such that an intensity measurement is carried out in each case for 6375 impingement locations.

Within the block 290, each particle beam 225 illuminates impingement locations arranged in nine different object regions 265 that are scanned successively. During the scanning of each of the surface regions 265, the second detection system records an image which can be taken as a basis for determining an assignment of detection signals detected by the individual detection elements of the first detection system to the individual particle beams.

Consequently, use is made of nine different assignments for 225 different successively obtained vectors 251 of detection signals. In this case, the scan path is chosen such that, taking account of the lateral extent of the convex envelope of the impingement locations contained in the surface region 263, the convex envelope of the impingement locations to which the same assignment is applied is as small as possible. This is made possible for example by the choice of the meandering scan path. This choice of scan path is based on the consideration that changes in the assignment of detection signals to particle beams are brought about by surface charges present locally at the surface. The surface charges do not act uniformly on all particle beams, but rather only on particle beams whose impingement locations on the object lie near the surface charge. Furthermore, it is assumed that the surface charges change slowly during the scanning. This consideration justifies using the same assignment of detection signals to particle beams for a plurality of impingement locations arranged successively in the scan path.

The scanning method has been explained above on the basis of simplified values for the number 25 of particle beams used, the number nine of the surface regions 265 contained in the surface region 263 scanned by a particle beam, and the number 25 for the number of the impingement locations which are contained in a surface region 265. In practice, the individual numerical values can be chosen to be significantly greater.

In the illustration in FIG. 7, the assignment of detection signals detected by the individual detector elements of the first detection system to the individual particle beams on the basis of the image analysis 253 is effected before the assignment of the detection signals assigned to the individual particle beams to the individual impingement locations on the basis of the scan signal 259 of the scan generator. This order can be interchanged, and the assignment to individual particle beams on the basis of the image analysis 253 can be effected after the assignment of the individual particle beams to the impingement locations on the basis of the scan signal 259.

Figure 10:
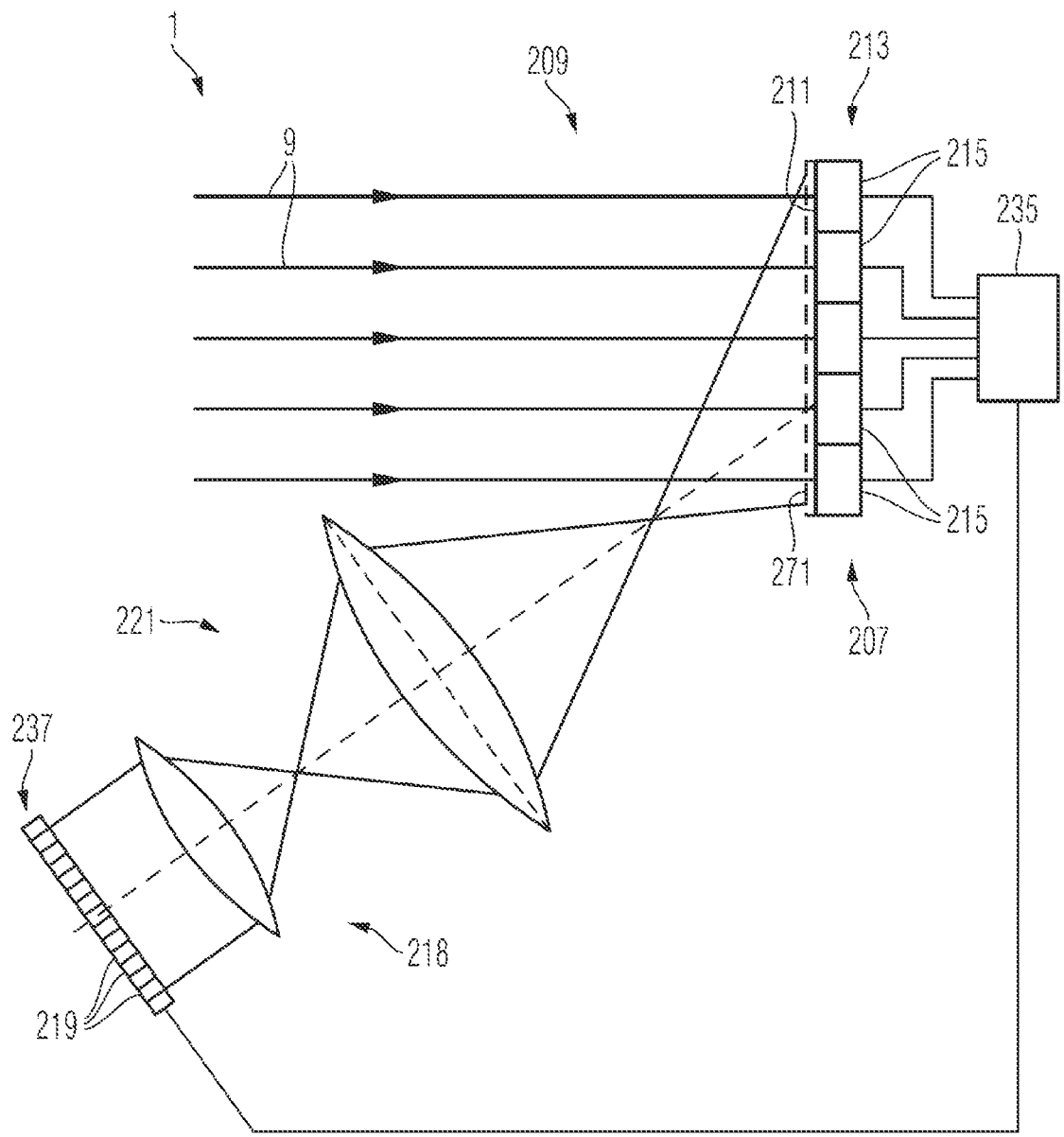
FIG. 10 shows a schematic illustration of an electron detector that is usable in the multi-beam particle beam microscope shown in FIG. 1.

FIG. 10 shows a further variant of an electron detector 209, which is usable in the multi-beam particle beam microscope in FIG. 1, in a schematic illustration. The electron detector 209 has an electron converter 207, on the surface 211 of which the electron beams 9 impinge from the left in the illustration in FIG. 10. The energy of the electrons of the electron beams 9 is converted into two different types of signals by the electron converter 207, which signals are detected by two different detection systems.

A first detection system 213 of the two detection systems includes detector elements 215 that are semiconductor elements, such as, for example, silicon drift detectors and PIN diodes. These are also part of the electron converter in that, in the semiconductor elements, the electrons of the electron beams 9 that penetrate into them are converted into first signals, namely electron-hole pairs, which initiate electrical signals in the semiconductor elements, which signals, after suitable amplification, are output to a controller 235 of the multi-beam particle beam microscope 1. The semiconductor elements of the detector elements 215 are electron detectors which are readable at a high rate, such as 40 MHz to 400 MHz, for example, and which convert impinging electrons into electrical signals. The number of the detector elements 215 of the first detection system 213 can be greater than or equal to the number of the electron beams 9 impinging on the electron converter 207.

A second detection system 218 of the electron detector 209 includes a light detector 237, such as a CCD sensor, for example, which has an array of detector elements or pixels 219. The number of the detector elements 219 of the second detection system 218 is significantly greater than the number of the detector elements 215 of the first detection system 213.

An optical imaging system 221 is provided between the electron converter 207 and the light detector 237, the optical imaging system optically imaging the surface 211 of the electron converter 207 onto the array of the detector elements 219 of the second detection system 218.

The electron converter 207, on account of its configuration including the semiconductor elements 215, is designed to convert a portion of the electrons of the electron beams 9 that impinge on it into the first signals, namely the electron-hole pairs, which are detected by the first detection system 213. A further portion of the electrons of the electron beams 9 that impinge on the electron converter 207 is converted into second signals, namely photons, which emerge from the surface 211 of the electron converter 207 on which the electron beams 9 also impinge. The photons emerge from the electron converter 207 towards the left in the illustration in FIG. 10.

A portion of these photons emerging at the surface 211 of the electron converter 207 is imaged onto the light detector 237 by the optical imaging system 221 and detected by the detection elements 219 of the light detector. The images detected by the light detector 237 are transmitted to the controller 235.

The signals detected by the second detection system 218 can be photons of various types. Firstly, the electron beams 9 impinging on the surface 211 of the electron converter 207 result in local heating there. This local heating generates photons that are detectable by the light detector 237 in the infrared range of the radiation spectrum. The photons have photon energies of 1 meV to 500 meV, for example.

In order to detect the photons, the light detector 237 and the optical imaging system 221 are advantageously embodied as an infrared camera. Using the infrared camera, a thermal image of the surface 211 of the electron converter 207 can thus be generated and then evaluated. The thermal image represents the distribution of the electron intensities impinging on the surface 211 of the electron converter 207. A read-out rate of the light detector 237 is significantly slower than the read-out rate of the detection elements 215 of the first detection system 213, but in return the number of the detection elements 219 of the second detection system 218 is significantly greater than the number of the detection elements 215 of the first detection system 213. As already explained above, on the basis of an image analysis of the images detected by the light detector 237, it is possible to carry out an improved assignment of the signals detected by the detection elements 215 of the first detection system 213 to the electron beams 9 impinging on the electron converter 207, and finally to the impingement locations of the particle beams 3 on the object 7.

As an alternative to the embodiment of the light detector 237 and the optical imaging system 221 as an infrared camera, a camera operating in the visible range of the light spectrum or in other ranges of the light spectrum can also be used if a layer 271 of scintillator material is provided at the surface 211 of the electron converter 207, the layer being illustrated by dashed lines in FIG. 10. The scintillator material converts the energy of a portion of the electrons of the electron beams 9 into photons having energies of 1 eV to 4 eV, for example, which are thus greater than the energies of the thermal radiation having photon energies of 1 meV to 500 meV, for example, which is generated as a result of the heating of the surface 211 of the electron converter 207.

The imaging of the photons generated by the layer 271 of scintillator material onto the light detector 237 generates there an image representing the distribution of the electron intensities impinging on the surface 211 of the electron converter 207. These images can once again be read out to the controller 235 and be used to assign the signals detected by the detection elements 215 of the first detection system 213 to the individual electron beams 9 and finally to the impingement locations of the particle beams 3 on the object 7.

What is claimed is:

1. A method, comprising:
   detecting a multiplicity of first signal intensities based on electron beams emanating from impingement locations of particle beams at an object; and
   assigning the first signal intensities to a multiplicity of image intensities associated with the multiplicity of particle beams using a determined relation; and
   generating an image based on the image intensities associated with the multiplicity of particle beams,
   wherein the multiplicity of particle beams are generated by a multi-beam particle beam microscope.

2. The method of claim 1, comprising assigning the first signal intensities so that cross-talk between the first signal intensities is reduced.

3. The method of claim 1, wherein the determined relation comprises a matrix.

4. The method of claim 3, wherein the multiplicity of first signal intensities is arranged as a vector of the first signal intensities, the multiplicity of image intensities is arranged as a vector of the image intensities, and the vector of the image intensities is calculable by multiplying the matrix with the vector of the first signal intensities.

5. The method of claim 1, comprising detecting the multiplicity of first signal intensities using a multiplicity of first detector elements.

6. The method of claim 5, further comprising:
   detecting a multiplicity of second signal intensities based on the electron beams emanating from the impingement locations of the particle beams at the object; and
   determining the determined relation based on the second signal intensities.

7. The method of claim 6, comprising detecting the multiplicity of second signal intensities using a multiplicity of second detector elements, wherein a number of the second detector elements is greater than a number of the first detector elements.

8. The method of claim 7, wherein the number of the second detector elements is at least two times greater than the number of the first detector elements.

9. The method of claim 1, further comprising:
   scanning the multiplicity of particle beams over the object; and
   repeatedly assigning the first signal intensities.

10. The method of claim 1, further comprising determining the determined relationship based on detection signals generated by the electron beams.

11. The method of claim 1, further comprising directing the particle beams onto the object.

12. The method of claim 1, comprising assigning the first signal intensities so that cross-talk between the first signal intensities is reduced, wherein the determined relation comprises a matrix.

13. The method of claim 12, wherein the multiplicity of first signal intensities is arranged as a vector of the first signal intensities, the multiplicity of image intensities is arranged as a vector of the image intensities, and the vector of the image intensities is calculable by multiplying the matrix with the vector of the first signal intensities.

14. The method of claim 1, comprising assigning the first signal intensities so that cross-talk between the first signal intensities is reduced, and detecting the multiplicity of first signal intensities using a multiplicity of first detector elements.

15. The method of claim 14, further comprising:
detecting a multiplicity of second signal intensities based on the electron beams emanating from the impingement locations of the particle beams at the object; and
determining the determined relation based on the second signal intensities.

16. The method of claim 15, comprising detecting the multiplicity of second signal intensities using a multiplicity of second detector elements, wherein a number of the second detector elements is greater than a number of the first detector elements.

17. The method of claim 16, wherein the number of the second detector elements is at least two times greater than the number of the first detector elements.

18. The method of claim 1, comprising assigning the first signal intensities so that cross-talk between the first signal intensities is reduced, and further comprising:
scanning the multiplicity of particle beams over the object; and
repeatedly assigning the first signal intensities.

19. The method of claim 1, comprising assigning the first signal intensities so that cross-talk between the first signal intensities is reduced, and further comprising assigning the first signal intensities so that cross-talk between the first signal intensities is reduced, and determining the determined relationship based on detection signals generated by the electron beams.

20. The method of claim 1, comprising assigning the first signal intensities so that cross-talk between the first signal intensities is reduced, and further comprising directing the particle beams onto the object.

* * * * *